(12) United States Patent
Sawai et al.

(10) Patent No.: US 9,558,862 B2
(45) Date of Patent: Jan. 31, 2017

(54) CONDUCTIVE POLYMER COMPOSITION, COATED ARTICLE HAVING ANTISTATIC FILM FORMED FROM THE COMPOSITION, AND PATTERNING PROCESS USING THE COMPOSITION

(71) Applicants: SHIN-ETSU POLYMER CO., LTD., Tokyo (JP); SHIN-ETSU CHEMICAL CO., LTD., Tokyo (JP)

(72) Inventors: Toshiya Sawai, Chiba (JP); Takayuki Nagasawa, Jyoetsu (JP); Satoshi Watanabe, Jyoetsu (JP); Keiichi Masunaga, Jyoetsu (JP)

(73) Assignees: SHIN-ETSU POLYMER CO., LTD., Tokyo (JP); SHIN-ETSU CHEMICAL CO., LTD., Tokyo (JP)

( * ) Notice: Subject to any disclaimer, the term of this patent is extended or adjusted under 35 U.S.C. 154(b) by 39 days.

(21) Appl. No.: 14/408,911

(22) PCT Filed: Jun. 6, 2013

(86) PCT No.: PCT/JP2013/003561
§ 371 (c)(1),
(2) Date: Dec. 17, 2014

(87) PCT Pub. No.: WO2014/006821
PCT Pub. Date: Jan. 9, 2014

(65) Prior Publication Data
US 2015/0140492 A1 May 21, 2015

(30) Foreign Application Priority Data
Jul. 2, 2012 (JP) .................................. 2012-148936

(51) Int. Cl.
| | | |
|---|---|---|
| G03F 7/11 | (2006.01) | |
| G03F 7/20 | (2006.01) | |
| C08K 5/16 | (2006.01) | |
| G03F 7/09 | (2006.01) | |
| H01B 1/12 | (2006.01) | |
| C08K 5/20 | (2006.01) | |

(52) U.S. Cl.
CPC ............... *H01B 1/127* (2013.01); *C08K 5/20* (2013.01); *G03F 7/093* (2013.01); *G03F 7/20* (2013.01); *G03F 7/2059* (2013.01); *G03F 7/2061* (2013.01)

(58) Field of Classification Search
CPC ......... H01B 1/124; H01B 1/125; H01B 1/127; H01B 1/128; G02F 2202/22; H01L 21/67396; H01J 2329/8685; H01J 2211/446; Y10S 260/18–260/19; Y10S 524/91; Y10S 260/20
See application file for complete search history.

(56) References Cited

U.S. PATENT DOCUMENTS

| | | |
|---|---|---|
| 5,019,485 A | 5/1991 | Nakamura et al. |
| 5,256,454 A | 10/1993 | Murai et al. |
| 5,560,870 A | 10/1996 | Watanabe et al. |
| 5,643,864 A | 7/1997 | Li et al. |
| 6,710,022 B1 | 3/2004 | Kwetkat et al. |
| 2007/0077510 A1 | 4/2007 | Nosella et al. |
| 2007/0181857 A1 | 8/2007 | Nishioka et al. |
| 2008/0145697 A1 | 6/2008 | Liu et al. |
| 2010/0252782 A1* | 10/2010 | Masahiro ................. C09D 5/24 252/511 |

FOREIGN PATENT DOCUMENTS

| | | |
|---|---|---|
| CN | 1127158 A | 7/1996 |
| EP | 0 041 780 A1 | 12/1981 |
| EP | 0 697 244 A1 | 2/1996 |
| JP | A-2-103547 | 4/1990 |
| JP | A-4-32848 | 2/1992 |
| JP | A-6-3813 | 1/1994 |
| JP | A-7-41756 | 2/1995 |
| JP | A-8-103646 | 4/1996 |
| JP | A-10-309449 | 11/1998 |
| JP | A-2002-514233 | 5/2002 |
| JP | A-2002-226721 | 8/2002 |
| JP | A-2003-509571 | 3/2003 |
| JP | A-2006-117925 | 5/2006 |
| JP | A-2006-152009 | 6/2006 |
| JP | A-2006-301073 | 11/2006 |
| JP | A-2007-102224 | 4/2007 |
| JP | A-2007-302743 | 11/2007 |
| JP | A-2008-108535 | 5/2008 |
| JP | A-2008-147035 | 6/2008 |
| JP | A-2009-161764 | 7/2009 |
| JP | A-2010-20046 | 1/2010 |
| JP | A-2010-514161 | 4/2010 |
| JP | A-2012-88697 | 5/2012 |
| JP | A-2012-145968 | 8/2012 |
| WO | WO 98/06768 A1 | 2/1998 |
| WO | WO 2006/033455 A1 | 3/2006 |

OTHER PUBLICATIONS

Weng et al "Gemini surfactant doped polypyrrole nanodipsersions: an inkjet printable formulation", Journal of Materials Chemistry, vol. 21, 2011, pp. 1918-1924.*
International Search Report issued in PCT/JP2013/003561 mailed Aug. 20, 2013.
Jan. 5, 2016 Extended European Search Report issued in European Application No. 13813440.8.
Jan. 6, 2015 International Preliminary Report on Patentability issued in International Application No. PCT/JP2013/003561.
Jun. 2, 2015 Office Action issued in Japanese Patent Application No. 2012-148936.
May 9, 2016 Search Report issued in Taiwanese Application No. 102121167.

* cited by examiner

*Primary Examiner* — Cynthia Hamilton
(74) *Attorney, Agent, or Firm* — Oliff PLC

(57) ABSTRACT

The present invention is a conductive polymer composition containing a π-conjugated conductive polymer, a polyanion, and a gemini surfactant. There can be provided a conductive polymer composition that has excellent antistatic performance and excellent application properties, does not adversely affect a resist, and can be suitably used in lithography using electron beam or the like.

16 Claims, No Drawings

CONDUCTIVE POLYMER COMPOSITION, COATED ARTICLE HAVING ANTISTATIC FILM FORMED FROM THE COMPOSITION, AND PATTERNING PROCESS USING THE COMPOSITION

BACKGROUND OF THE INVENTION

Field of the Invention

The present invention relates to a conductive polymer composition containing a π-conjugated conductive polymer, a coated article using the same, and a patterning process. In particular, the present invention relates to a conductive polymer composition that is suitably used for prevention of electrification of a resist in lithography using ultraviolet light, electron beam, or the like, an article having an antistatic film formed by using the same, and a patterning process using the composition.

Description of the Related Art

Conventionally, in a process of producing a semiconductor device such as IC and LSI, microprocessing by a lithography process using a photoresist has been carried out. This is a method of etching a substrate using as a mask a resist pattern that is obtained by a development treatment using a solvent or the like, the development treatment in which light irradiation induces bridging or a decomposition reaction of a thin film to remarkably change the solubility of the thin film. In recent years, with increased integration of a semiconductor device, high-precision microprocessing using light beam with short wavelength has been required. The development of lithography using electron beam has been advanced as a next generation technique since the electron beam has short-wavelength properties.

The lithography using electron beam has a specific problem of electrification phenomenon (charge-up) during exposure. This is a phenomenon in which in a substrate to be irradiated with electron beam that is covered with an insulating resist film, the resist film is charged with electricity by accumulation of charge on or in the resist film. An orbital of incident electron beam is bent by this electrification, and therefore the precision of drawing is significantly reduced. Accordingly, an antistatic film to be applied on an electron beam resist has been investigated.

However, when the antistatic film is formed on a chemically amplified resist, the shape or the sensitivity of the resist may change. For example, when an acid produced by exposure is neutralized by a component in the antistatic film, an exposed area of the resist in a positive type is not dissolved during development, or an exposed area of the resist in a negative type is partially dissolved during development. Alternatively, by an acid component in the antistatic film, a non-exposed area of the resist in the positive type is partially dissolved during development, or a non-exposed area of the resist in the negative type is not dissolved during development. Since the chemically amplified resist does not have resistance to most organic solvent, an aqueous antistatic agent to be formed on the resist is often used. However, since a surface of the chemically amplified resist is hydrophobic, the aqueous antistatic agent is unlikely to be applied. Therefore, it is necessary to add a surfactant, and the like. However, the addition of the surfactant may also adversely affect the resist, for example, on the surface of which a mixing layer is formed.

In order to reduce such adverse effects on the resist, Patent Document 1 discloses a conductive composition for formation of a resist pattern that contains an acidic group-substituted aniline-based conductive polymer (A) and a solvent (B), wherein the content of acid component with a molecular weight of 500 or less is 0.03% by mass or less.

Patent Document 2 discloses a conductive composition containing a water-soluble conductive polymer (a) having a sulfonic acid group and/or a carboxyl group, a water-soluble polymer (b) having a nitrogen-containing functional group and a terminal hydrophobic group as a polymeric surfactant that is unlikely to adversely affect a resist, and a solvent (c).

Patent Document 3 discloses an antistatic agent containing a water-soluble conductive polymer, a solvent, and a water-soluble polymer having a chemical structure represented by —(N(R')—CH(R)—C(=O))—.

PRIOR ART DOCUMENTS

Patent Documents

Patent Document 1: Japanese Patent Laid-Open (kokai) No. 2006-301073

Patent Document 2: Japanese Patent Laid-Open (kokai) No. 2002-226721

Patent Document 3: Japanese Patent Laid-Open (kokai) No. 2009-161764

SUMMARY OF THE INVENTION

However, a method described in Patent Document 1 requires further purification of a conductive polymer in an organic solvent, and therefore is not preferred in terms of process.

A method described in Patent Document 2 requires use of a malodor-generating compound such as a mercapto group as a chain transfer agent for introduction of the terminal hydrophobic group, and therefore is not preferred in terms of operation. Further, the thickness of a resist film may be slightly thin, and therefore is not sufficient to prevent damage of the resist film.

Patent Document 3 discloses the antistatic agent containing a water-soluble conductive polymer, a solvent, and a water-soluble polymer having a chemical structure represented by —(N(R')—CH(R)—C(=O))—, that is, a water-soluble polymer having a polypeptide structure as a repeating structure that is obtained by dehydration-condensation of an α-amino group and an α-carboxyl group of amino acid. However, depending on the kind of surfactant to be used, the thickness of a resist film may be slightly thin, and therefore is not sufficient to prevent damage of the resist film.

The present invention was made in view of the above situation, and has an object to provide a conductive polymer composition that has excellent antistatic performance, and in particular, can be suitably used in lithography using electron beam or the like.

In order to solve the problems, the present invention provides a conductive polymer composition comprising a π-conjugated conductive polymer, a polyanion, and a gemini surfactant.

Such a conductive polymer composition is a conductive polymer composition that has excellent antistatic performance and excellent application properties, does not adversely affect a resist, and therefore can be suitably used in lithography using electron beam or the like.

In this case, it is preferable that the gemini surfactant be represented by the following general formula (1),

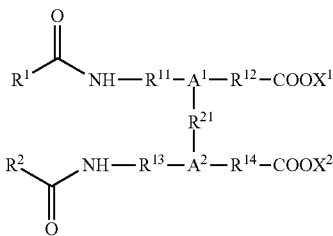 (1)

wherein, each of $A^1$ and $A^2$ independently represents CH or N; each of $R^1$ and $R^2$ independently represents an alkyl group or alkenyl group that may be linear or branched and has 5 to 22 carbon atoms, whose any hydrogen atom may be substituted by a fluorine atom; each of $R^{11}$, $R^{12}$, $R^{13}$, and $R^{14}$ independently represents —$(CH_2)_n$—, wherein "n" represents any of 0, 1, and 2; $R^{21}$ represents any of —$CH_2$—, —$CH_2CH_2$—, —$CH_2CH_2CH_2$—, and —$(CH_2)_m$—$R^{22}$—$(CH_2)_p$—, wherein each of "m" and "p" independently represents an integer of 2 to 5 and $R^{22}$ represents a single bond or a divalent organic group; and each of $X^1$ and $X^2$ independently represents any of H, Na, K, and $NH_4$.

When the conductive polymer composition of the present invention contains a gemini surfactant represented by the general formula (1), the wetting properties to a surface of a body to be processed are good, and a uniform film can be obtained.

Further, the conductive polymer composition may contain a water-soluble polymer.

By containing a water-soluble polymer, the strength of a coating film formed by using the conductive polymer composition of the present invention can be maintained, and flattening properties can be obtained.

The content of the gemini surfactant is preferably 10 parts by mass to 1,000 parts by mass relative to 100 parts by mass of a composite of the π-conjugated conductive polymer and the polyanion.

When the content of the gemini surfactant is such a value, the wetting properties to a resist surface are improved, and the conductivity is also sufficient.

Further, the conductive polymer composition may be used for formation of an antistatic film.

The present invention further provides a coated article comprising an antistatic film formed by using the conductive polymer composition on a body to be processed.

An antistatic film formed from the conductive polymer composition of the present invention has excellent antistatic performance. Therefore when such an antistatic film is used to cover various bodies to be processed, coated articles having high quality can be obtained.

In this case, as the body to be processed, a substrate having a chemically amplified resist film may be used.

Since the conductive polymer composition of the present invention does not adversely affect a resist, the substrate having a chemically amplified resist film, which is unlikely to be applied conventionally, can be selected as the body to be processed which an antistatic film is formed thereon from the composition of the present invention.

Moreover, the present invention provides a patterning process comprising steps of forming an antistatic film on a chemically amplified resist film of a substrate having the chemically amplified resist film by using the conductive polymer composition, irradiating in a pattern with electron beam, and developing with an alkaline developer to obtain a resist pattern.

According to the patterning process of the present invention, a resist pattern having high sensitivity, high resolution, and good pattern profile can be obtained.

As described above, since the conductive polymer composition of the present invention has excellent antistatic performance, it can be suitably used for prevention of electrification.

Also in application to lithography using photoresist, the conductive polymer composition has excellent application properties without adverse effects such as insolubilization of a resist and film loss. Therefore, the conductive polymer composition can be suitably used in lithography using electron beam or the like, and thereby a resist pattern having high sensitivity, high resolution, and good pattern profile can be obtained.

DETAILED DESCRIPTION OF THE PREFERRED EMBODIMENTS

Hereinafter, embodiments of the present invention will be described in detail, but the present invention is not limited to the embodiments.

In recent years, application of an antistatic film has been considered even in a production process of a semiconductor device as described above. However, the conventional conductive composition and the like have problems such as adverse effects on a resist.

The present inventors have intensively investigated to solve the above-described problems, and as a result, found that when a specific surfactant is used, a conductive polymer composition that has excellent antistatic performance and excellent application properties, does not adversely affect a resist, and can be suitably used in lithography using electron beam or the like can be obtained. Thus, the present invention has been completed.

The conductive polymer composition of the present invention contains a π-conjugated conductive polymer, a polyanion, and a gemini surfactant.

Hereinafter, the present invention will be described in more detail.

(π-Conjugated Conductive Polymer)

As the π-conjugated conductive polymer, an organic polymer whose main chain consists of a π-conjugated chain can be used. Examples thereof include polypyrroles, polythiophenes, polyacetylenes, polyphenylenes, polyphenylenevinylenes, polyanilines, polyacenes, polythiophenevinylenes, and copolymers thereof.

In terms of easy polymerization and stability in air, polypyrroles, polythiophenes, and polyanilines are preferred.

Even when the π-conjugated conductive polymer is not substituted, sufficient conductivity can be achieved. In order to further enhance conductivity, a functional group such as an alkyl group, a carboxy group, a sulfo group, an alkoxy group, a hydroxy group, and a cyano group may be introduced in the π-conjugated conductive polymer.

Specific examples of such a π-conjugated conductive polymer include polypyrrole, poly(N-methylpyrrole), poly(3-methylpyrrole), poly(3-ethylpyrrole), poly(3-n-propylpyrrole), poly(3-butylpyrrole), poly(3-octylpyrrole), poly(3-decylpyrrole), poly(3-dodecylpyrrole), poly(3,4-dimethylpyrrole), poly(3,4-dibutylpyrrole), poly(3-carboxypyrrole), poly(3-methyl-4-carboxypyrrole), poly(3-methyl-4-carboxyethylpyrrole), poly(3-methyl-4-carboxybutylpyrrole), poly(3-hydroxypyrrole), poly(3-methoxypyrrole), poly(3-ethoxypyrrole), poly(3-butoxypyrrole), poly(3-hexyloxypyrrole), poly(3-methyl-4- hexyloxypyrrole), poly(3-methyl-4-hexyloxypyrrole), polythiophene, poly(3-methylthiophene), poly(3-ethylthiophene), poly(3-propylthiophene), poly(3-butylthiophene), poly(3-hexylthiophene), poly(3-heptylthiophene), poly(3-octylthiophene), poly(3-decylthiophene), poly(3-dodecylthiophene), poly(3-octadecylthiophene), poly(3-bromothiophene), poly(3-chlorothiophene), poly(3-iodothiophene), poly(3-cyanothiophene), poly(3-phenylthiophene), poly(3,4-dimethylthiophene), poly(3,4-dibutylthiophene), poly(3-hydroxythiophene), poly(3-methoxythiophene), poly(3-ethoxythiophene), poly(3-butoxythiophene), poly(3-hexyloxythiophene), poly(3-heptyloxythiophene), poly(3-octyloxythiophene), poly(3-decyloxythiophene), poly(3-dodecyloxythiophene), poly(3-octadecyloxythiophene), poly(3,4-dihydroxythiophene), poly(3,4-dimethoxythiophene), poly(3,4-diethoxythiophene), poly(3,4-diopropoxythiophene), poly(3,4-dibutoxythiophene), poly(3,4-dihexyloxythiophene), poly(3,4-diheptyloxythiophene), poly(3,4-dioctyloxythiophene), poly(3,4-didecyloxythiophene), poly(3,4-didodecyloxythiophene), poly(3,4-ethylenedioxythiophene), poly(3,4-propylenedioxythiophene), poly(3,4-butenedioxythiophene), poly(3-methyl-4-methoxythiophene), poly(3-methyl-4-ethoxythiophene), poly(3-carboxythiophene), poly(3-methyl-4-carboxythiophene), poly(3-methyl-4-carboxyethylthiophene), poly(3-methyl-4-carboxybutylthiophene), polyaniline, poly(2-methylaniline), poly(3-isobutylaniline), poly(2-aniline sulfonic acid), and poly(3-aniline sulfonic acid).

In particular, a (co)polymer of one or two selected from polypyrrole, polythiophene, poly(N-methylpyrrole), poly(3-methylthiophene), poly(3-methoxythiophene), and poly(3,4-ethylenedioxythiophene) is suitably used in terms of resistance and reactivity. Further, polypyrrole and poly(3,4-ethylenedioxythiophene) are more preferred in terms of high conductivity.

(Polyanion)

The polyanion used in the present invention is a polymer having a plurality of anionic groups in one molecule, and can be obtained by a method of polymerizing a monomer having an anionic group or copolymerizing a monomer having an anionic group with a monomer having no anionic group. The monomers can be used singly or in combination of two or more kinds. Further, the polyanion can be also obtained by obtaining a polymer having no anionic group, and sulfonating the polymer with a sulfonating agent such as sulfuric acid, fuming sulfuric acid, and sulfamic acid. When a polymer having an anionic group is obtained, followed by sulfonation, a polyanion having an anionic group in a higher content can be obtained.

Examples of a monomer constituting the polyanion used in the present invention include monomers containing strong acidic groups such as $-O-SO_3^-X^+$, $-SO_3^-X^+$, $-COO^-X^+$, $-O-PO_4^-X^+$, and $-PO_4^-X^+$ wherein, $X^+$ represents a hydrogen ion, or an alkali metal ion. Among these, $-SO_3^-X^+$ and $-COO^-X^+$ are preferred in terms of doping effect on π-conjugated conductive polymer. It is preferable that the anionic groups be disposed in a main chain of the polyanion adjacently or at certain intervals.

Examples of a sulfonic acid group-containing monomer include styrene sulfonic acid, allyloxybenzene sulfonic acid, methallyloxybenzene sulfonic acid, vinyl sulfonic acid, allyl sulfonic acid, methallyl sulfonic acid, 2-(methacryloxy) ethane sulfonic acid, 4-(methacryloxy)butane sulfonic acid, isoprene sulfonic acid, and 2-acrylamide-2-methylpropane sulfonic acid. These monomers may be used singly or in combination of two or more kinds, or may be used in a salt form which is obtained by neutralization with a base such as ammonia, triethylamine, and sodium hydroxide.

Examples of a phosphoric acid group-containing monomer include 3-chloro-2-acid phosphoxy propyl (meth)acrylate, acid phosphoxy polyoxyethylene glycol mono(meth)acrylate, mono(2-hydroxyethyl acrylate) acid phosphate, mono(2-hydroxyethyl methacrylate) acid phosphate, mono(2-hydroxypropyl acrylate) acid phosphate, mono(2-hydroxypropyl methacrylate) acid phosphate, mono(3-hydroxypropyl acrylate) acid phosphate, mono(3-hydroxypropyl methacrylate) acid phosphate, diphenyl-2-acryloyloxyethyl phosphate, and diphenyl-2-methacryloyloxyethyl phosphate. These monomers may be used singly or in combination of two or more kinds, or may be used in a salt form which is obtained by neutralization with a base such as ammonia, triethylamine, and sodium hydroxide.

Examples of a carboxyl group-containing monomer include an ethylenically unsaturated monocarboxylic acid such as acrylic acid, methacrylic acid, and crotonic acid; an ethylenically unsaturated polyvalent carboxylic acid such as maleic acid, fumaric acid, and itaconic acid, and anhydrides thereof; and a partially esterified product of an ethylenically unsaturated polyvalent carboxylic acid such as methyl maleate and methyl itaconate. These monomers may be used singly or in combination of two or more kinds, or may be used in a salt form which is obtained by neutralization with a base such as ammonia, triethylamine, and sodium hydroxide.

As another monomer which is copolymerizable with an anionic group-containing monomers and having no anionic group, a known compounds can be used without restriction. Examples thereof include a conjugated diene monomer such as 1,3-butadiene, isoprene, 2-chloro-1,3-butadiene, and 2-methyl-1,3-butadiene; an aromatic vinyl monomer such as styrene, α-methyl styrene, and p-methyl styrene; an ethylenically unsaturated carboxylic acid alkyl ester monomer such as methyl(meth)acrylate, ethyl(meth)acrylate, butyl(meth)acrylate, and 2-ethylhexyl(meth)acrylate; an ethylenically unsaturated carboxylic acid amide monomer such as acrylamide, methacrylamide, N,N-dimethylacrylamide, and N-methylolacrylamide; an ethylenically unsaturated carboxylic acid hydroxyalkyl ester monomer such as hydroxyalkyl (meth)acrylate and glycerin di(meth)acrylate; carboxylic acid vinyl ester monomer such as vinyl acetate; (meth)acrylonitrile, N-vinylpyrrolidone, (meth)acryloylmorpholine, cyclohexylmaleimide, isopropylmaleimide, and glycidyl(meth)acrylate.

When the monomer is polymerized using an initiator, the polyanion used in the present invention can be obtained.

The polyanion used in the present invention can be also obtained by known methods such as production of sulfonated polyester from sulfonated dicarboxylic acid and diol (Japanese Patent Laid-Open (kokai) No. 2007-102224), production of sulfonated polyimide from a sulfonated diamino compound and tetracarboxylic acid dianhydride (Japanese Patent Laid-Open (kokai) Nos. 2006-152009 and 2007-302743), and production of sulfonated polyurethane by polymerization of sulfonated polyesterpolyol and polyisocyanate (Japanese translation of PCT international application No. 2002-514233).

Further, the polyanion used in the present invention can be also obtained by polymerizing polystyrene or polymethylstyrene and then sulfonating it with a sulfonating agent such as sulfuric acid, fuming sulfuric acid, and sulfamic acid.

Moreover, the polyanion used in the present invention can be also obtained by sulfonation of polyether ketone (EP0041780), sulfonation of polyether ether ketone (Japanese Patent Laid-Open (kokai) No. 2008-108535), sulfonation of polyether sulfone (Japan Patent Laid-Open (kokai) No. H10-309449), sulfonation of polyphenylene, polyfluorene, or polyvinyl carbazole (Japanese translation of PCT international application No. 2010-514161), sulfonation of polyphenylene oxide, and sulfonation of polyphenylene sulfide.

Among the polyanions, in terms of solubility in a solvent and conductivity, polyisoprene sulfonic acid, a copolymer containing polyisoprene sulfonic acid, polysulfoethyl methacrylate, a copolymer containing polysulfoethyl methacrylate, poly(4-sulfobutyl methacrylate), a copolymer containing poly(4-sulfobutyl methacrylate), polymethallyloxybenzene sulfonic acid, a copolymer containing polymethallyloxybenzene sulfonic acid, polystyrene sulfonic acid, and a copolymer containing polystyrene sulfonic acid are preferred. In particular, polystyrene sulfonic acid, polysulfoethyl methacrylate, and poly(4-sulfobutyl methacrylate) are more preferred.

The degree of polymerization of polyanion is preferably within a range of 10 to 100,000 monomer units, and in terms of solubility in a solvent and conductivity, is more preferably within a range of 50 to 10,000. The molecular weight of the polyanion is preferably 10,000 to 1,000,000. When the molecular weight is equal to or more than the lower limit, a solution in which the π-conjugated conductive polymer is uniform is easily obtained. When it is equal to or less than the upper limit, the conductivity is also improved.

In the conductive polymer composition according to the present invention, the polyanion is coordinated to the π-conjugated conductive polymer to form a composite of the π-conjugated conductive polymer and the polyanion.

(Method for Producing Composite of π-Conjugated Conductive Polymer and Polyanion)

The composite of the π-conjugated conductive polymer and the polyanion can be obtained by, for example, adding a monomer as a raw material for the π-conjugated conductive polymer (that is preferably pyrrole or a derivative monomer thereof, thiophene or a derivative monomer thereof, or aniline or a derivative monomer thereof) to an aqueous solution of the polyanion or a water and organic solvent mixed solution of the polyanion, an oxidizing agent, and in some cases, an oxidation catalyst, and carrying out oxdation polymerization. When the polyanion is dissolved in a form of an alkali metal salt, an ammonium salt, an amine salt, or the like, it is preferable that a reaction solution be made acidic by addition of an inorganic acid such as sulfuric acid, hydrochloric acid, nitric acid, phosphoric acid, and perchloric acid or an organic acid to the system.

As the oxidizing agent and the oxidation catalyst, peroxodisulfate such as ammonium peroxodisulfate, sodium peroxodisulfate, and potassium peroxodisulfate, a transition metal compound such as ferric chloride, ferric sulfate, and cupric chloride, a metal oxide such as silver oxide and cesium oxide, a peroxide such as hydrogen peroxide and ozone, an organic peroxide such as benzoyl peroxide, or oxygen may be used.

As a reaction solvent used in oxdation polymerization, water, or water and a solvent mixed solution may be used. It is preferable that the solvent used in this case be a solvent that is miscible with water and is capable of dissolving or dispersing the polyanion or the π-conjugated conductive polymer as described below. Examples thereof include polar solvents such as N-methyl-2-pyrrolidone, N,N'-dimethylformamide, N,N'-dimethylacetamide, dimethyl sulfoxide, and hexamethylene phosphortriamide, alcohols such as methanol, ethanol, propanol, and butanol, aliphatic polyvalent alcohols such as ethylene glycol, propylene glycol, dipropylene glycol, 1,3-butylene glycol, 1,4-butylene glycol, D-glucose, D-glucitol, isoprene glycol, butanediol, 1,5-pentanedial, 1,6-hexandiol, 1,9-nonanediol, and neopentyl glycol, carbonate compounds such as ethylene carbonate and propylene carbonate, cyclic ether compounds such as dioxane and tetrahydrofuran, chain ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether, heterocyclic ring compounds such as 3-methyl-2-oxazolidinone, and nitrile compounds such as acetonitrile, glutaronitrile, methoxyacetonitrile, propionitrile, and benzonitrile. These solvents may be used singly or in a mixture of two or more kinds. The mixing ratio of the solvent that is miscible with water relative to water is preferably 50% by mass or less of the whole reaction solvent.

In addition to the polyanion, an anion which can be doped with the π-conjugated conductive polymer may be used in combination. In this case, an organic acid is preferred from the viewpoints of dedoping properties from the π-conjugated conductive polymer, and regulating dispersibility, heat resistance, and environmental resistance of the conductive composition according to the present invention. Examples of the organic acid include an organic carboxylic acid, phenols, and an organic sulfonic acid.

As the organic carboxylic acid, an aliphatic acid, an aromatic acid, or a cyclic aliphatic acid that contains one or two or more carboxyl group(s) may be used. Examples thereof include formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoroacetic acid, nitroacetic acid, and triphenylacetic acid.

Examples of phenols include cresol, phenol, and xylenol.

As the organic sulfonic acid, an aliphatic acid, an aromatic acid, or a cyclic aliphatic acid that contains one or two or more sulfonic acid group(s) may be used. Examples of those containing one sulfonic acid group include sulfonic acid compounds containing a sulfonic acid group such as methane sulfonic acid, ethane sulfonic acid, 1-propane sulfonic acid, 1-butane sulfonic acid, 1-hexane sulfonic acid, 1-heptane sulfonic acid, 1-octane sulfonic acid, 1-nonane sulfonic acid, 1-decane sulfonic acid, 1-dodecane sulfonic acid, 1-tetradecane sulfonic acid, 1-pentadecane sulfonic acid, 2-bromoethane sulfonic acid, 3-chloro-2-hydroxypropane sulfonic acid, trifluoromethane sulfonic acid, colistinmethane sulfonic acid, 2-acrylamide-2-methylpropane sulfonic acid, aminomethane sulfonic acid, 1-amino-2-naphthol-4-sulfonic acid, 2-amino-5-naphthol-7-sulfonic acid, 3-aminopropane sulfonic acid, N-cyclohexyl-3-aminopropane sulfonic acid, benzene sulfonic acid, p-toluene sulfonic acid, xylene sulfonic acid, ethylbenzene sulfonic acid, propylbenzene sulfonic acid, butylbenzene sulfonic acid, pentylbenzene sulfonic acid, hexylbenzene sulfonic acid, heptylbenzene sulfonic acid, octylbenzene sulfonic acid, nonylbenzene sulfonic acid, decylbenzene sulfonic acid, undecylbenzene sulfonic acid, dodecylbenzene sulfonic acid, pentadecylbenzene sulfonic acid, hexadecylbenzene sulfonic acid, 2,4-dimethylbenzene sulfonic acid, dipropylbenzene sulfonic acid, butylbenzene sulfonic acid, 4-aminobenzene sulfonic acid, o-aminobenzene sulfonic acid, m-aminobenzene sulfonic acid, 4-amino-2-chlorotoluene-5-sulfonic acid, 4-amino-3-methylbenzene-1-sulfonic acid, 4-amino-5-methoxy-2-methylbenzene sulfonic acid, 2-amino-5-methylbenzene-1-sulfonic acid, 4-amino-2-methylbenzene-1-sulfonic acid, 5-amino-2-methylbenzene-1-sulfonic acid, 4-acetamide-3-chlorobenzene sulfonic acid, 4-chloro-3-nitrobenzene sulfonic acid, p-chlorobenzene sulfonic acid, naphthalene sulfonic acid, methylnaphthalene sulfonic acid, propylnaphthalene sulfonic acid, butylnaphthalene sulfonic acid, pentylnaphthalene sulfonic acid, dimethylnaphthalene sulfonic acid, 4-amino-1-naphthalene sulfonic acid, 8-chloronaphthalene-1-sulfonic acid, a naphthalene sulfonate formaldehyde polycondensate, and a melamine sulfonate formaldehyde polycondensate.

Examples of those containing two or more sulfonic acid groups include ethane disulfonic acid, butane disulfonic acid, pentane disulfonic acid, decane disulfonic acid, m-benzene disulfonic acid, o-benzene disulfonic acid, p-benzene disulfonic acid, toluene disulfonic acid, xylene disulfonic acid, chlorobenzene disulfonic acid, fluorobenzene disulfonic acid, aniline-2,4-disulfonic acid, aniline-2,5-disulfonic acid, dimethylbenzene disulfonic acid, diethylbenzene disulfonic acid, dibutylbenzene disulfonic acid, naphthalene disulfonic acid, methylnaphthalene disulfonic acid, ethylnaphthalene disulfonic acid, dodecylnaphthalene disulfonic acid, pentadecylnaphthalene disulfonic acid, butylnaphthalene disulfonic acid, 2-amino-1,4-benzene disulfonic acid, 1-amino-3,8-naphthalene disulfonic acid, 3-amino-1,5-naphthalene disulfonic acid, 8-amino-1-naphthol-3,6-disulfonic acid, 4-amino-5-naphthol-2,7-disulfonic acid, anthracene disulfonic acid, butylanthracene disulfonic acid, 4-acetamide-4'-isothiocyanatostilbene-2,2'-disulfonic acid, 4-acetamide-4'-maleimidylstilbene-2,2'-disulfonic acid, 1-acetoxypyrene-3,6,8-trisulfonic acid, 7-amino-1,3,6-naphthalene trisulfonic acid, 8-aminonaphthalene-1,3,6-trisulfonic acid, and 3-amino-1,5,7-naphthalene trisulfonic acid.

Before polymerization of a monomer as the material for the π-conjugated conductive polymer, the anion other than the polyanion may be added to a solution that contains the monomer, the polyanion, an oxidizing agent, and/or an oxidation polymerization catalyst; or after polymerization of the monomer as the material for the π-conjugated conductive polymer, the anion may be added to a conductive polymer composition containing the polyanion and the π-conjugated conductive polymer.

The resultant composite of the π-conjugated conductive polymer and the polyanion may be granulated by a homogenizer or a ball mill, if necessary, before use.

A mixing dispersing machine capable of imparting high shear force is preferably used in granulation. Examples of the mixing dispersing machine include a homogenizer, a high-pressure homogenizer, and a bead mill. In particular, a high-pressure homogenizer is preferred.

Specific examples of the high-pressure homogenizer include nanomizer (trade name) manufactured by YOSHIDA KIKAI CO., LTD., microfluidizer (trade name) manufactured by Microfluidics, and ultimizer manufactured by Sugino Machine Limited.

Examples of a dispersion treatment using a high-pressure homogenizer include a treatment in which counter collision is carried out at high pressure in a composite solution before the dispersion treatment, and a treatment in which the composite solution is passed through orifices or slits at high pressure.

Before or after granulation, impurities may be removed by a procedure such as filtration, ultrafiltration, and dialysis, followed by purification with a cation exchange resin, an anion exchange resin, or a chelate resin.

It is preferable that the total content of the π-conjugated conductive polymer and the polyanion in the conductive polymer composition be 0.05 to 5.0% by mass. When the total content of the π-conjugated conductive polymer and the polyanion is 0.05% by mass or more, sufficient conductivity can be achieved. When it is 5.0% by mass or less, a uniform conductive coating film can be easily obtained.

The pH of the composite of the π-conjugated conductive polymer and the polyanion may be adjusted with an ammonia aqueous solution, an aqueous solution of alkylamine such as trimethylamine, an aqueous solution of imidazole derivative such as imidazole, an aqueous sodium hydroxide solution, or an aqueous potassium hydroxide solution before use. The pH is preferably within a range of 4 to 8. When the pH is within a range of 4 or more and 8 or less, a resist is more unlikely to be damaged.

The content of the polyanion preferably is such an amount that the content of anionic group in the polyanion is within a range of 0.1 to 10 mole, and more preferably within a range of 1 to 7 mole, relative to 1 mole of the π-conjugated conductive polymer. When the content of anionic group in the polyanion is 0.1 mole or more, the doping effect to the π-conjugated conductive polymer is high, and sufficient conductivity can be achieved. When the content of anionic group in the polyanion is 10 mole or less, the content of the π-conjugated conductive polymer is also appropriate, and sufficient conductivity can be achieved.

(Gemini Surfactant)

The gemini surfactant is a surfactant compound in which at least two surfactant units consisting of a hydrophilic head group and a hydrophobic group are bonded to each other in a vicinity of the hydrophilic group through an interval-holding part called spacer (e.g., see Japanese translation of PCT international application No. 2003-509571). The gemini surfactant has excellent interfacial properties including extremely low critical micelle concentration and high surface tension-decreasing performance, excellent foaming power and emulsifying power, good solubility in water, and resistance to hard water, due to structural properties thereof.

In the present invention, any known gemini surfactant can be used.

Only one kind of the gemini surfactant may be used, or a mixture of two or more kinds thereof may be used.

The gemini surfactant suitably used in the present invention is a compound represented by the following general formula (1),

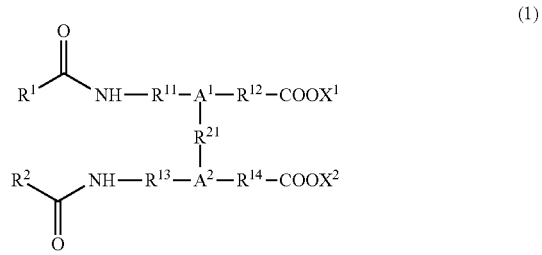

(1)

wherein, each of $A^1$ and $A^2$ independently represents CH or N; each of $R^1$ and $R^2$ independently represents an alkyl group or alkenyl group that may be linear or branched and has 5 to 22 carbon atoms, whose any hydrogen atom may be substituted by a fluorine atom; each of $R^{11}$, $R^{12}$, $R^{13}$, and $R^{14}$ independently represents —$(CH_2)_n$—, wherein "n" represents any of 0, 1, and 2; $R^{21}$ represents any of —$CH_2$—, —$CH_2CH_2$—, —$CH_2CH_2CH_2$—, and —$(CH_2)_m$—$R^{22}$—$(CH_2)_p$—, wherein each of "m" and "p" independently represents an integer of 2 to 5 and $R^{22}$ represents a single bond or a divalent organic group; and each of $X^1$ and $X^2$ independently represents any of H, Na, K, and $NH_4$.

The "organic group" herein means a group containing at least one carbon atom, and further contains a hydrogen atom, and may contain a nitrogen, oxygen, sulfur, silicon, or halogen atom.

Specific examples of $R^1$ and $R^2$ include a hexyl group, an octyl group, a nonyl group, a decyl group, a dodecyl group, a hexadecyl group, an octadecyl group, a behenyl group, an isostearyl group, a 2-ethylhexyl group, an oleyl group, and a linolyl group.

Specific examples of the organic group of $R^{22}$ include —$OCH_2CH_2O$—, —$OCH_2CH_2OCH_2CH_2O$—, —$OCH(CH_3)CH_2O$—, —$OCH(CH_3)CH_2OCH(CH_3)CH_2O$—, —$OCH_2CH_2CH_2O$—, —$OCH_2CH(OH)CH_2O$—, and groups shown below.

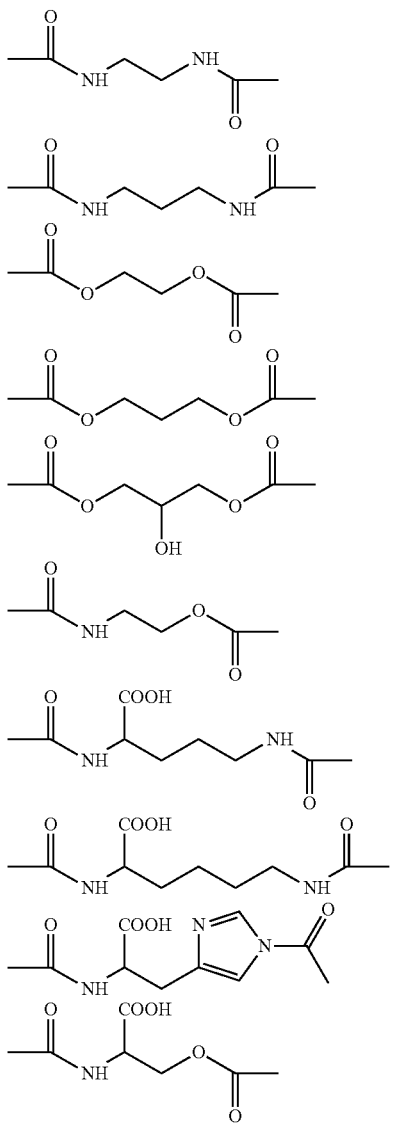

Examples of the gemini surfactant suitably used in the present invention include N,N-(bishexadecanamidoethyl) ethylenediamine-N,N-diacetic acid, N,N-(bislauramidoethyl)ethylenediamine-N,N-diacetic acid, N,N-(bislauramidoethyl)ethylenediamine-N,N-dipropionic acid, N,N-(bisdecanamidoethyl)ethylenediamine-N,N-diacetic acid, N,N-(bisoctanamidoethyl)ethylenediamine-N,N-diacetic acid, lysine dilauroyl glutamate, ethylenediamine dilauroyl glutamate, and propylenediamine dilauroyl glutamate.

The content of the gemini surfactant is preferably 10 parts by mass to 1,000 parts by mass, and more preferably 30 parts by mass to 300 parts by mass, relative to 100 parts by mass of the composite of the π-conjugated conductive polymer and the polyanion. When the content of the gemini surfactant is equal to or more than the lower limit, the wetting properties to a resist surface are improved. When it is equal to or less than the upper limit, sufficient conductivity is achieved.

(Water-Soluble Polymer)

In the present invention, a water-soluble polymer may be added to maintain the strength of a coating film and impart flattening properties. The water-soluble polymer used in the present invention can be obtained, for example, by homopolymerization or copolymerization of, as a monomer component, vinyl pyrrolidone, vinyl pyridine, vinyl caprolactam, vinyl alcohol, (meth)acrylamide, hydroxyethyl(meth)acrylate, hydroxypropyl(meth)acrylate, hydroxystyrene, vinyl aniline, N-methyl methacrylamide, N-ethyl methacrylamide, N-benzyl methacrylamide, N-phenyl methacrylamide, N,N-dimethyl methacrylamide, acrylic acid, sodium acrylate, sulfopropyl acrylate, sodium sulfopropyl acrylate, vinylbenzoic acid, sodium vinylbenzoate, styrene sulfonic acid, sodium styrene sulfonate, maleic acid, sodium meleate, a trimethyl(acryloyloxyethyl) ammonium salt, a triethyl (acryloyloxymethyl) ammonium salt, a trimethyl(styrylcarbonyloxyethyl) ammonium salt, and a vinyl ether compound such as methyl vinyl ether.

Another copolymerizable monomer can be copolymerized as long as the properties of water-soluble resin are not lost. Examples of the copolymerizable monomer include acrylates such as methyl acrylate, ethyl acrylate, isopropyl acrylate, benzyl acrylate, naphthyl acrylate, phenyl acrylate, isobutyl acrylate, tert-butyl acrylate, cyclohexyl acrylate, isobornyl acrylate, 2-methoxy ethyl acrylate, methoxytriethylene glycol acrylate, and 2-ethoxy ethyl acrylate, methacrylates such as ethyl methacrylate, n-propyl methacrylate, n-pentyl methacrylate, cyclohexyl methacrylate, benzyl methacrylate, naphthyl methacrylate, phenyl methacrylate, 2-phenylethyl methacrylate, 2,2,2-trifluoroethyl methacrylate, 2,2,2-trichloroethyl methacrylate, methyl acrylate, isobutyl methacrylate, methoxy diethylene glycol methacrylate, and methoxy polyethylene glycol methacrylate, maleimide, and styrene compounds such as styrene, methylstyrene, chlorostyrene, bromostyrene, and hydroxystyrene.

In addition to the polymers, a polysaccharide such as partially saponified polyvinyl alcohol, maltodextrin, polydextrose, hydroxyethyl cellulose, and heparin, a water-soluble epoxy resin, a water-soluble phenolic resin, a water-soluble polyester resin, or a water-soluble urethane resin can be used.

The weight average molecular weight of the water-soluble polymer is preferably 400 to 1,000,000, and particularly preferably 500 to 500,000.

(Surfactant)

In the present invention, a surfactant other than the gemini surfactant may be added to enhance the wetting properties to the body to be processed such as a substrate. Examples of such a surfactant include various surfactants such as a nonionic surfactant, a cationic surfactant, and an anionic surfactant. Specific examples thereof include nonionic surfactants such as polyoxyethylene alkyl ether, polyoxyethylene alkyl phenyl ether, a polyoxyethylene carboxylic acid ester, a sorbitan ester, and a polyoxyethylene sorbitan ester, cationic surfactants such as alkyl trimethyl ammonium chloride and alkyl benzyl ammonium chloride, anionic surfactants such as an alkyl or alkylallyl sulfate salt, an alkyl or alkylallyl sulfonate salt, and a dialkyl sulfosuccinate salt, and amino acid-type, betaine-type, and the like amphoteric surfactants.

The conductive polymer composition of the present invention can be obtained by, for example, mixing the composite of the π-conjugated conductive polymer and the polyanion, the gemini surfactant, a solvent, and in some cases, the water-soluble polymer, and the surfactant etc., adjusting the pH of the mixture, and if necessary, filtrating the mixture by a filter or the like.

It is particularly preferable that the conductive polymer composition of the present invention be a composition obtained by mixing poly(3,4-ethylenedioxythiophene) doped with polystyrene sulfonic acid and lysine dilauroyl glutamate, and adjusting the pH of the mixture with ammonia.

When the obtained conductive polymer composition is applied to a body to be processed such as a substrate, an antistatic film can be formed. Examples of a method for applying the conductive polymer composition include coating by a bar coater or the like, spin coating, immersion, comma coating, spray coating, roll coating, and gravure printing. After the application, a heat treatment by a hot air circulating furnace, a hot plate, or the like is carried out to form an antistatic film.

Examples of the body to be processed include a glass substrate, a quartz substrate, a photomask blank substrate, a resin substrate, a silicon wafer, and a compound semiconductor wafer such as a gallium arsenic wafer and an indium phosphorus wafer.

Examples of a coated article that is coated with the antistatic film obtained from the conductive polymer composition of the present invention include a glass substrate having the antistatic film, a resin film having the antistatic film, and a resist substrate having the antistatic film.

In particular, since the conductive polymer composition of the present invention does not adversely affect a resist, a substrate having a chemically amplified resist film may be also suitably used.

Specifically, the present invention provides a patterning process comprising steps of forming an antistatic film on a chemically amplified resist film of a substrate having the chemically amplified resist film by using the conductive polymer composition of the present invention, irradiating in a pattern with electron beam, and developing with an alkaline developer to obtain a resist pattern.

The patterning process can be performed in accordance with a conventional method except that the conductive polymer composition of the present invention is used, and the development may be performed after exposure followed by a heat treatment, and that other processes such as etching, resist-removing, and washing steps may be also performed.

According to the patterning process, an electrification phenomenon during exposure can be prevented, and a pattern having high sensitivity, high resolution, and good pattern profile can be obtained.

The present invention is designed to be used for lithography using electron beam or the like. However, since the antistatic performance is excellent, the present invention can be suitably used for lithography using ultraviolet light, or for preventing electrification of a film and glass.

EXAMPLES

Hereinafter, the present invention will be described specifically with reference to Examples and Comparative Examples, but the present invention is not restricted to the following Examples.

A measurement method and an evaluation method of each physical property are as follows. In the following, K-359SD-1 spinner (manufactured by Kyowa Riken Co., Ltd.) was used in production of an antistatic film and a resist film by spin coating. The thickness of the resist film and the antistatic film were each determined by digging a groove with a width of about 1 mm and measuring the level difference by AlphaStepIQ (manufactured by KLA-Tencor Corporation).

As a positive chemically amplified resist, a positive chemically amplified electron beam resist SEBP-9012 available from Shin-Etsu Chemical Co., Ltd., was used. As a negative chemically amplified electron beam resist, SEBN-1702 available from Shin-Etsu Chemical Co., Ltd., was used.

As a conductive polymer composition, a conductive polymer composition shown in each of the following Examples 1 to 10 and Comparative Examples 1 to 6 was used.

(1) Evaluation of Wetting Properties to Resist (Measurement of Contact Angle)

0.8 mL of positive chemically amplified resist was dropped on soda-lime glass with 75×75 mm, and immediately applied through spin coating by a spinner at 500 rpm for 10 seconds and at 1,250 rpm for 30 seconds. The glass was pre-baked in an accuracy incubator at 90° C. for 5 minutes to remove a solvent. Thus, a resist film was obtained.

On a surface of the obtained resist film, a droplet of 0.2 µL of the conductive polymer composition was formed. After 10 seconds, a contact angle between the droplet and the resist film was measured. The contact angle was measured by a contact angle meter DM-301 manufactured by Kyowa Interface Science Co., Ltd. The results are shown in Table 1.

(2) Peelability by Water Rinsing

On the resist film obtained in (1), 10 µL of the conductive polymer composition was dropped, and the resist was heated in an accuracy incubator at 85° C. for 5 minutes, and left at normal temperature for 5 minutes in air. The formed antistatic film was rinsed off with ion-exchanged water in a wash-bottle. A case where the antistatic film is peeled within 10 seconds is evaluated as ○, a case where the antistatic film is peeled in more than 10 seconds and 20 seconds or less is evaluated as Δ, and a case where the antistatic film is partially peeled and remains is evaluated as x. The results are shown in Table 1.

(3) Resist Damage

In the substrate after the evaluation of peelability by water rinsing in (2), a case where the color of a resist area of the substrate is not changed is evaluated as ○, and a case where the color is changed is evaluated as x.

(4) Surface Resistance

On the resist film obtained in (1), 1.0 mL of the conductive polymer composition was dropped, and after 10 seconds, applied to the whole resist film through spin coating by a spinner. The spin coating condition was adjusted so that the thickness was 50±5 nm. The resist film was pre-baked in an accuracy incubator at 85° C. for 5 minutes to remove a solvent. Thus, an antistatic film was obtained.

The surface resistance of the antistatic film was measured by Hiresta-UP MCP-HT450 (manufactured by Mitsubishi Chemical Corporation). The results are shown in Table 1.

(5) Evaluation of Electron Beam Lithography and Change Ratio of Film Loss

Evaluation of Peeling Process before PEB

A positive chemically amplified resist SEBP-9012 was applied to a 6-inch silicon wafer through spin coating by MARK VIII (Coater/developer CLEAN TRACK, manufactured by Tokyo Electron Limited), and pre-baked at 110° C. for 240 seconds on a hot plate to prepare a resist film with a thickness of 150 nm <film thickness (T1)>. The conductive polymer composition was applied to the obtained wafer with the resist through spin coating by MARK VIII in the same manner as described above, and baked at 90° C. for 90 seconds on a hot plate, to prepare a conductive polymer film with a thickness of 50 nm. After exposing by an electron beam exposure device (HL-800D manufactured by Hitachi High-Technologies Corporation, accelerating voltage: 50 keV), then the conductive film was peeled by throwing pure water for 15 seconds, and baked at 90° C. for 240 seconds (PEB: post exposure bake). Then developing with an aqueous solution of 2.38% by mass tetramethylammonium hydroxide was carried out, and a positive pattern (film thickness of non-exposed area (T3)> was obtained.

Evaluation of Peeling Process after PEB

A positive chemically amplified resist SEBP-9012 was applied to a 6-inch silicon wafer through spin coating by MARK VIII (Coater/developer CLEAN TRACK, manufactured by Tokyo Electron Limited), and pre-baked at 110° C. for 240 seconds on a hot plate to prepare a resist film with a thickness of 150 nm <film thickness (T1)>. The conductive polymer composition was applied to the obtained wafer with the resist through spin coating by MARK VIII in the same manner as described above, and baked at 90° C. for 90 seconds on a hot plate, to prepare a conductive polymer film with a thickness of 50 nm. After exposing by an electron beam exposure device (HL-800D manufactured by Hitachi High-Technologies Corporation, accelerating voltage: 50 keV), and baking at 90° C. for 240 seconds (PEB: post exposure bake), developing with an aqueous solution of 2.38% by mass tetramethylammonium hydroxide was carried out, and a positive pattern (film thickness of non-exposed area (T3)> was obtained.

A resist film without a conductive polymer film was also subjected to the same peeling process after PEB. The optimum exposure dose and the resist film thickness (T2) in a non-exposed area after exposure and development were determined. The change ratio in film thickness was calculated from the following equation in each of peeling processes before PEB and peeling processes after PEB. The results are shown in Table 2 and Table 3.

Change ratio of film loss in each process (%)={(T1−T3)−(T1−T2)/(T1−T2)}×100

The resist pattern obtained in each process was evaluated as follows.

The produced wafer with a pattern was observed by a top SEM (scanning electron microscope). The exposure dose in which a 400-nm line-and-space is resolved at a 1:1 is defined as the optimal exposure dose (sensitivity) ($\mu C/cm^2$), and the minimum dimension in the optimum exposure dose is defined as a resolution. The pattern area was cleaved, and whether the pattern profile was rectangular or not was determined by visual check of a SEM image. The results are shown in Table 2 and Table 3. The change ratio of sensitivity was calculated as a deviation (%) to the sensitivity of SEBP-9012.

A negative resist SEBN-1702 was subjected to the same process evaluation. The results are shown in Table 4 and Table 5. Since a non-exposed area was removed by a developer, the change ratio of film loss was not evaluated. The change ratio of sensitivity was calculated as a deviation (%) to the sensitivity of SEBN-1702.

Production Example 1

Preparation of Polystyrene Sulfonic Acid 206 g of sodium styrene sulfonate was dissolved in 1,000 mL of ion-exchanged water. An oxidizing agent solution in which 1.14 g of ammonium persulfate was dissolved in 10 mL of water in advance was added dropwise at 80° C. with stirring for 20 minutes, and the solution was stirred for 2 hours. To the obtained sodium styrene sulfonate-containing solution, 1,000 mL of sulfuric acid diluted to 10% by mass and 10,000 mL of ion-exchanged water were added, and about 10,000 mL of polystyrene sulfonic acid-containing solution was removed by ultrafiltration. To the residue, 10,000 mL of ion-exchanged water was added, and about 10,000 mL of the solution was removed by ultrafiltration. This ultrafiltration operation was repeated 3 times.

To the obtained filtrate, about 10,000 mL of ion-exchanged water was added, and about 10,000 mL of the solution was removed by ultrafiltration. This ultrafiltration operation was repeated 3 times.

Water in the resultant solution was removed under reduced pressure, to obtain solid colorless polystyrene sulfonic acid.

The ultrafiltration condition was as follows (the same applied in other examples).

Fractional molecular weight of ultrafiltration film: 30 K
Cross-flow procedure
Flow rate of liquid to be supplied: 3,000 mL/min
Film partial pressure: 0.12 Pa Production Example 2

Preparation of Dispersion Liquid of poly(3,4-ethylenedioxythiophene) Doped with polystyrene sulfonic Acid 14.2 g of 3,4-ethylenedioxythiophene and a solution of 36.7 g of polystyrene sulfonic acid obtained in Production Example 1 in 2,000 mL of ion-exchanged water were mixed at 20° C.

The obtained mixed solution was held at 20° C. 29.64 g of ammonium persulfate dissolved in 200 mL of ion-exchanged water and an oxidation catalyst solution of 8.0 g of ferric sulfate were slowly added with stirring, and stirred for 3 hours, to cause a reaction.

To the obtained reaction solution, 2,000 mL of ion-exchanged water was added, and about 2,000 mL of the solution was removed by ultrafiltration. This operation was repeated 3 times.

To the treatment liquid after the ultrafiltration, 200 mL of sulfuric acid that was diluted to 10% by mass and 2,000 mL of ion-exchanged water were added, and about 2,000 mL of the treatment liquid was removed by ultrafiltration. To this liquid, 2,000 mL of ion-exchanged water was added, and about 2,000 mL of the liquid was removed by ultrafiltration. This operation was repeated 3 times.

To the obtained treatment liquid, 2,000 mL of ion-exchanged water was added, and about 2,000 mL of the treatment liquid was removed by ultrafiltration. This operation was repeated 5 times to prepare a blue dispersion liquid of 1.2% by mass poly(3,4-ethylenedioxythiophene) doped with polystyrene sulfonic acid (PEDOT-PSS).

Production Example 3

Synthesis of polysulfoethyl methacrylate 216 g of sodium sulfoethyl methacrylate was dissolved in 1,000 mL of ion-exchanged water. An oxidizing agent solution in which 1.14 g of ammonium persulfate was dissolved in 10 mL of water in advance was added dropwise at 80° C. with stirring for 20 minutes, and the solution was stirred for 12 hours. To the obtained polysulfoethyl methacrylate-containing solution, 1,000 mL of sulfuric acid diluted to 10% by mass and 10,000 mL of ion-exchanged water were added, and about 10,000 mL of polystyrene sulfonic acid-containing solution was removed by ultrafiltration. To the residue, 10,000 mL of ion-exchanged water was added, and about 10,000 mL of the solution was removed by ultrafiltration. This ultrafiltration operation was repeated 3 times.

To the obtained filtrate, about 10,000 mL of ion-exchanged water was added, and about 10,000 mL of the solution was removed by ultrafiltration. This ultrafiltration operation was repeated 3 times. Water in the resultant solution was removed under reduced pressure, to obtain an aqueous solution of 10% by mass polysulfoethyl methacrylate.

Production Example 4

Preparation of Dispersion Liquid of poly(3,4-ethylenedioxythiophene) Doped with polysulfoethyl methacrylate A dispersion liquid of 1.2% by mass poly(3,4-ethylenedioxythiophene) doped with polysulfoethyl methacrylate was obtained in the same manner as in Production Example 2 except that 386 g of aqueous solution of 10% by mass polysulfoethyl methacrylate obtained in Production Example 3 was used instead of 36.7 g of polystyrene sulfonic acid and dissolved in 1,614 g of ion-exchanged water.

Example 1

The pH of the dispersion liquid of 1.2% by mass PEDOT-PSS obtained in Production Example 2 was adjusted to 6.5 with 1% ammonia water. 20 g of this dispersion liquid, 60 g of ion-exchanged water, 3.0 g of aqueous solution of 5% by mass polyvinylpyrrolidone (prepared by diluting polybinylpyrrolidone available from Aldrich with an average molecular weight of 55,000 with ion-exchanged water to 5% by mass), and 1.8 g of pellicer (registered trademark) L-30 (aqueous solution containing 29% sodium lysine dilauroyl glutamate, available from Asahi Kasei Chemicals Corp.) were mixed and then filtrated through a PVDF filter with a pore diameter of 0.45 μm (available from Millipore Corporation) to prepare a conductive polymer composition.

Example 2

A conductive polymer composition was prepared in the same manner as in Example 1 except that the amount of pellicer (registered trademark) L-30 was changed to 0.3 g.

Example 3

A conductive polymer composition was prepared in the same manner as in Example 1 except that the amount of pellicer (registered trademark) L-30 was changed to 0.6 g.

Example 4

A conductive polymer composition was prepared in the same manner as in Example 1 except that the amount of dispersion liquid of 1.2% by mass PEDOT-PSS of which the pH was adjusted to 6.5 with 1% ammonia water in the same manner as in Example 1 was changed to 40 g, the amount of ion-exchanged water was changed to 40 g, and the amount of pellicer (registered trademark) L-30 was changed to 1.4 g.

Example 5

A conductive polymer composition was prepared in the same manner as in Example 1 except that the amount of dispersion liquid of 1.2% by mass PEDOT-PSS of which the pH was adjusted to 6.5 with 1% ammonia water in the same manner as in Example 1 was changed to 50 g, the amount of ion-exchanged water was changed to 30 g, and the amount of pellicer (registered trademark) L-30 was changed to 2.5 g.

Example 6

A conductive polymer composition was prepared in the same manner as in Example 1 except that the amount of dispersion liquid of 1.2% by mass PEDOT-PSS of which the pH was adjusted to 6.5 with 1% ammonia water in the same manner as in Example 1 was changed to 30 g, the amount of ion-exchanged water was changed to 50 g, and the amount of pellicer (registered trademark) L-30 was changed to 3.0 g.

Example 7

A conductive polymer composition was prepared in the same manner as in Example 1 except that 0.9 g of 10% N,N-(bislauramidoethyl)ethylenediamine-N,N-diacetic acid aqueous solution was used instead of pellicer (registered trademark) L-30.

As N,N-(bislauramidoethyl)ethylenediamine-N,N-diacetic acid used in this Example, one that was synthesized by a method described in European Patent Application Publication No. 0697244, and then purified with an ion exchange resin was used.

Example 8

A conductive polymer composition was prepared in the same manner as in Example 7 except that the amount of dispersion liquid of 1.2% by mass PEDOT-PSS of which the pH was adjusted to 6.5 with 1% ammonia water in the same manner as in Example 1 was changed to 40 g, the amount of ion-exchanged water was changed to 40 g, and the amount of 10% N,N-(bislauramidoethyl) ethylenediamine-N,N-diacetic acid aqueous solution was changed to 2.0 g.

Example 9

The pH of dispersion liquid of 1.2% by mass poly(3,4-ethylenedioxythiophene) doped with polysulfoethyl methacrylate obtained in Production Example 4 was adjusted to 6.5 with 1% ammonia water. 20 g of this dispersion liquid, 60 g of ion-exchanged water, 3.0 g of aqueous solution of 5% by mass polyvinylpyrrolidone, and 0.3 g of pellicer (registered trademark) L-30 were mixed and then filtrated through a PVDF filter with a pore diameter of 0.45 μm (available from Millipore Corporation) to prepare a conductive polymer composition.

Example 10

A conductive polymer composition was prepared in the same manner as in Example 9 except that the amount of dispersion liquid of 1.2% by mass poly(3,4-ethylenedioxythiophene) doped with polysulfoethyl methacrylate of which the pH was adjusted to 6.5 with 1% ammonia water in the same manner as in Example 9 was changed to 50 g, the amount of ion-exchanged water was changed to 30 g, and the amount of pellicer (registered trademark) L-30 was changed to 2.5 g.

Comparative Example 1

A conductive polymer composition was prepared in the same manner as in Example 1 except that pellicer (registered trademark) L-30 was not used.

Comparative Example 2

A conductive polymer composition was prepared in the same manner as in Example 1 except that 2.5 g of aqueous solution of 10% sodium dodecylsulfate (available from Tokyo Chemical Industry Co., Ltd.) was used instead of pellicer (registered trademark) L-30.

Comparative Example 3

A conductive polymer composition was prepared in the same manner as in Example 1 except that 2.5 g of aqueous solution of 10% Triton X-100 (available from Tokyo Chemical Industry Co., Ltd.) was used instead of pellicer (registered trademark) L-30, and aqueous solution of 5% by mass polyvinylpyrrolidone was not used.

Comparative Example 4

A conductive polymer composition was prepared in the same manner as in Example 1 except that 2.5 g of aqueous solution of 10% Triton X-100 (available from Tokyo Chemical Industry Co., Ltd.) was used instead of pellicer (registered trademark) L-30.

Comparative Example 5

A conductive polymer composition was prepared in the same manner as in Example 1 except that 0.5 g of aqueous solution of 30% promois W-52 (available from SEIWA KASEI Co., Ltd., hydrolyzed collagen, number average molecular weight: 2,000) was used instead of pellicer (registered trademark) L-30.

Comparative Example 6

A conductive polymer composition was prepared in the same manner as in Example 1 except that 0.5 g of aqueous solution of 30% promois W-52 (available from SEIWA KASEI Co., Ltd., hydrolyzed collagen, number average molecular weight: 2,000) and 2.5 g of aqueous solution of 10% sodium dodecylsulfate (available from Tokyo Chemical Industry Co., Ltd.) were used instead of pellicer (registered trademark) L-30.

Tables 1 to 5 show the contact angle, peelability by water rinsing, resist damage, surface resistance, and evaluation of lithography by electron beam-drawing machine in an antistatic film obtained from the conductive polymer composition prepared in each of Examples and Comparative Examples.

TABLE 1

| | Contact angle (°) | Peelability by water rinsing | Resist damage | surface resistance (Ω/square) |
|---|---|---|---|---|
| Example 1 | 40 | ○ | ○ | $4.1 \times 10^{10}$ |
| Example 2 | 43 | ○ | ○ | $5.8 \times 10^{8}$ |
| Example 3 | 41 | ○ | ○ | $8.2 \times 10^{9}$ |
| Example 4 | 41 | ○ | ○ | $5.4 \times 10^{9}$ |
| Example 5 | 42 | ○ | ○ | $7.2 \times 10^{9}$ |
| Example 6 | 40 | ○ | ○ | $6.5 \times 10^{10}$ |
| Example 7 | 38 | ○ | ○ | $7.7 \times 10^{8}$ |
| Example 8 | 37 | ○ | ○ | $3.1 \times 10^{8}$ |
| Example 9 | 41 | ○ | ○ | $9.2 \times 10^{7}$ |
| Example 10 | 40 | ○ | ○ | $1.6 \times 10^{8}$ |
| Comparative Example 1 | 70 | ○ | ○ | Not Measurable |
| Comparative Example 2 | 31 | ○ | x | $9.3 \times 10^{9}$ |
| Comparative Example 3 | 65 | ○ | x | Not Measurable |
| Comparative Example 4 | 65 | ○ | x | Not Measurable |
| Comparative Example 5 | 72 | x | ○ | Not Measurable |
| Comparative Example 6 | 32 | ○ | ○ | $6.1 \times 10^{9}$ |

TABLE 2

Lithography evaluation of peeling before PEB
(Combination of SEBP-9012 and conductive polymer composition prepared in each of Examples 1 to 10 and Comparative Examples 1 to 6)

| | Sensitivity (μC/cm²) | Resolution (nm) | Change ratio of sensitivity (%) | Change ratio of film loss (%) | Pattern profile |
|---|---|---|---|---|---|
| Only SEBP-9012 | 20.0 | — | — | — | Rectangular |
| Example 1 | 19.7 | 80 | −1.5 | 0.1 | Rectangular |
| Example 2 | 19.9 | 80 | −0.5 | 2.2 | Rectangular |
| Example 3 | 19.9 | 80 | −0.5 | 1.4 | Rectangular |
| Example 4 | 19.8 | 80 | −1.0 | 1.7 | Rectangular |
| Example 5 | 20.1 | 80 | 0.5 | 1.5 | Rectangular |
| Example 6 | 19.9 | 80 | −0.5 | 0.0 | Rectangular |
| Example 7 | 19.8 | 80 | −1.0 | 2.5 | Rectangular |
| Example 8 | 19.7 | 80 | −1.5 | 4.0 | Rectangular |
| Example 9 | 19.8 | 80 | −1.0 | 1.8 | Rectangular |
| Example 10 | 19.9 | 80 | −0.5 | 1.3 | Rectangular |
| Comparative Example 1 | Not Evaluable | — | — | — | — |
| Comparative Example 2 | Not Evaluable | — | — | >300 | — |
| Comparative Example 3 | Not Evaluable | — | — | — | — |

TABLE 2-continued

Lithography evaluation of peeling before PEB
(Combination of SEBP-9012 and conductive polymer
composition prepared in each of Examples 1 to 10 and
Comparative Examples 1 to 6)

| | Sensitivity (μC/cm²) | Resolution (nm) | Change ratio of sensitivity (%) | Change ratio of film loss (%) | Pattern profile |
|---|---|---|---|---|---|
| Comparative Example 4 | Not Evaluable | — | — | — | — |
| Comparative Example 5 | Not Evaluable | — | — | — | — |
| Comparative Example 6 | 18.9 | 100 | −5.5 | 21.8 | rounded top |

TABLE 3

Lithography evaluation of peeling after PEB
(Combination of SEBP-9012 and conductive polymer
composition prepared in each of Examples 1 to 10 and
Comparative Examples 1 to 6)

| | Sensitivity (μC/cm²) | Resolution (nm) | Change ratio of sensitivity (%) | Change ratio of film loss (%) | Pattern profile |
|---|---|---|---|---|---|
| Only SEBP-9012 | 20.0 | 80 | — | — | Rectangular |
| Example 1 | 20.5 | 80 | 2.5 | 0.5 | Rectangular |
| Example 2 | 21.8 | 80 | 9.0 | 2.3 | Rectangular |
| Example 3 | 21.9 | 80 | 9.5 | 1.8 | Rectangular |
| Example 4 | 21.8 | 80 | 9.0 | 1.8 | Rectangular |
| Example 5 | 21.7 | 80 | 8.5 | 2.2 | Rectangular |
| Example 6 | 20.5 | 80 | 2.5 | 1.1 | Rectangular |
| Example 7 | 21.8 | 80 | 9.0 | 3.3 | Rectangular |
| Example 8 | 21.9 | 80 | 9.5 | 5.2 | Rectangular |
| Example 9 | 21.8 | 80 | 9.0 | 1.9 | Rectangular |
| Example 10 | 21.7 | 80 | 8.5 | 1.9 | Rectangular |
| Comparative Example 1 | Not Evaluable | — | — | — | — |
| Comparative Example 2 | Not Evaluable | — | — | >300 | — |
| Comparative Example 3 | Not Evaluable | — | — | — | — |
| Comparative Example 4 | Not Evaluable | — | — | — | — |
| Comparative Example 5 | Not Evaluable | — | — | — | — |
| Comparative Example 6 | 27.7 | 110 | 38.5 | 33.5 | rounded top |

TABLE 4

Lithography evaluation of peeling before PEB
(Combination of SEBN-1702 and conductive polymer
composition prepared in each of Examples 1 to 10 and
Comparative Examples 1 to 6)

| | Sensitivity (μC/cm²) | Resolution (nm) | Change ratio of sensitivity (%) | Pattern profile |
|---|---|---|---|---|
| Only SEBN-1702 | 20.5 | 80 | — | Rectangular |
| Example 1 | 20.3 | 80 | −0.9 | Rectangular |
| Example 2 | 20.2 | 80 | −1.5 | Rectangular |
| Example 3 | 20.2 | 80 | −1.5 | Rectangular |
| Example 4 | 20.4 | 80 | −0.5 | Rectangular |
| Example 5 | 20.1 | 80 | −2.0 | Rectangular |
| Example 6 | 20.4 | 80 | −0.5 | Rectangular |
| Example 7 | 20.3 | 80 | −1.0 | Rectangular |
| Example 8 | 20.1 | 80 | −2.0 | Rectangular |
| Example 9 | 20.3 | 80 | −0.9 | Rectangular |
| Example 10 | 20.4 | 80 | −1.5 | Rectangular |
| Comparative Example 1 | Not Evaluable | — | — | — |
| Comparative Example 2 | Not Evaluable | — | — | — |
| Comparative Example 3 | Not Evaluable | — | — | — |
| Comparative Example 4 | Not Evaluable | — | — | — |
| Comparative Example 5 | Not Evaluable | — | — | — |
| Comparative Example 6 | 18.5 | 100 | −9.7 | Bridge |

TABLE 5

Lithography evaluation of peeling after PEB
(Combination of SEBN-1702 and conductive polymer
composition prepared in each of Examples 1 to 10 and
Comparative Examples 1 to 6)

| | Sensitivity (μC/cm²) | Resolution (nm) | Change ratio of sensitivity (%) | Pattern profile |
|---|---|---|---|---|
| Only SEBN-1702 | 20.5 | 80 | — | Rectangular |
| Example 1 | 21.0 | 80 | 2.4 | Rectangular |
| Example 2 | 22.2 | 80 | 8.3 | Rectangular |
| Example 3 | 22.3 | 80 | 8.8 | Rectangular |
| Example 4 | 21.9 | 80 | 6.8 | Rectangular |
| Example 5 | 22.1 | 80 | 7.8 | Rectangular |
| Example 6 | 21.0 | 80 | 2.4 | Rectangular |
| Example 7 | 21.8 | 80 | 6.3 | Rectangular |
| Example 8 | 22.2 | 80 | 8.3 | Rectangular |
| Example 9 | 22.2 | 80 | 8.8 | Rectangular |
| Example 10 | 21.8 | 80 | 6.3 | Rectangular |
| Comparative Example 1 | Not Evaluable | — | — | — |
| Comparative Example 2 | Not Evaluable | — | — | — |
| Comparative Example 3 | Not Evaluable | — | — | — |
| Comparative Example 4 | Not Evaluable | — | — | — |
| Comparative Example 5 | Not Evaluable | — | — | — |
| Comparative Example 6 | 24.5 | 110 | 19.5 | Bridge |

As shown in Table 1, Examples 1 to 10 that are compositions of the present invention exhibited good wetting properties to a resist film, and a uniform coating film could be obtained by spin coater.

On the other hand, Comparative Examples 1 and 3 to 5 in which a gemini surfactant was not used exhibited poor wetting properties to a resist film, and a uniform coating film could not be obtained.

Comparative Example 2 using sodium dodecylsulfate instead of a gemini surfactant exhibited good wetting properties, but resist damage was observed. Also in Comparative Examples 3 and 4 using a nonionic surfactant Triton X-100, resist damage was observed.

Since Comparative Examples 1 and 3 to 5 exhibited poor wetting properties to a resist film, and a uniform coating film could not be obtained, the surface resistance thereof could not be measured.

As shown in Tables 2 to 5, even in evaluation of lithography using electron beam, cases using the antistatic film obtained from the composition of the present invention (Examples 1 to 10) exhibit good sensitivity, small sensitivity change, good resolution, and good pattern profile.

On the other hand, Comparative Examples 1 and 3 to 5 exhibit poor wetting properties to a resist film, and a uniform coating film cannot be obtained, Comparative Example 2 has a damaged resist film and no pattern, and therefore the lithography evaluation cannot be performed. In Comparative Example 6, a uniform film is obtained, but the sensitivity is reduced, mixing in a resist is high, and deterioration of resolution and pattern profile is observed.

The present invention is not restricted to the embodiments shown above. The embodiments shown above are merely examples so that any embodiments composed of substantially the same technical concept as disclosed in the claims of the present invention and expressing a similar effect are included in the technical scope of the present invention.

The invention claimed is:

1. A conductive polymer composition for formation of an antistatic film on a chemically amplified resist film, the conductive polymer composition comprising a π-conjugated conductive polymer, a polyanion, and a gemini surfactant.

2. The conductive polymer composition according to claim 1, wherein the gemini surfactant is represented by the following general formula (1),

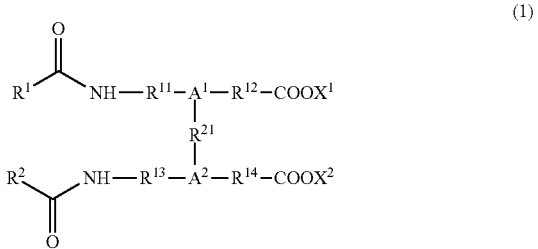

wherein, each of $A^1$ and $A^2$ independently represents CH or N; each of $R^1$ and $R^2$ independently represents an alkyl group or alkenyl group that may be linear or branched and has 5 to 22 carbon atoms, whose any hydrogen atom may be substituted by a fluorine atom; each of $R^{11}$, $R^{12}$, $R^{13}$, and $R^{14}$ independently represents $-(CH_2)_n-$, wherein "n" represents any of 0, 1, and 2; $R^{21}$ represents any of $-CH_2-$, $-CH_2CH_2-$, $-CH_2CH_2CH_2-$, and $-(CH_2)_m-R^{22}-(CH_2)_p-$, wherein each of "m" and "p" independently represents an integer of 2 to 5 and $R^{22}$ represents a single bond or a divalent organic group; and each of $X^1$ and $X^2$ independently represents any of H, Na, K, and $NH_4$.

3. The conductive polymer composition according to claim 2, further comprising a water-soluble polymer.

4. The conductive polymer composition according to claim 3, wherein the content of the gemini surfactant is 10 parts by mass to 1,000 parts by mass relative to 100 parts by mass of a composite of the π-conjugated conductive polymer and the polyanion.

5. A patterning process comprising steps of forming an antistatic film on a chemically amplified resist film of a substrate having the chemically amplified resist film from the conductive polymer composition according to claim 3, irradiating the chemically amplified resist film in a pattern with electron beam, and developing the chemically amplified resist film with an alkaline developer to obtain a resist pattern.

6. The conductive polymer composition according to claim 2, wherein the content of the gemini surfactant is 10 parts by mass to 1,000 parts by mass relative to 100 parts by mass of a composite of the π-conjugated conductive polymer and the polyanion.

7. A patterning process comprising steps of forming an antistatic film on a chemically amplified resist film of a substrate having the chemically amplified resist film from the conductive polymer composition according to claim 6, irradiating the chemically amplified resist film in a pattern with electron beam, and developing the chemically amplified resist film with an alkaline developer to obtain a resist pattern.

8. A coated article comprising an antistatic film formed from the conductive polymer composition according to claim 2 on a substrate having a chemically amplified resist film.

9. A patterning process comprising steps of forming an antistatic film on a chemically amplified resist film of a substrate having the chemically amplified resist film from the conductive polymer composition according to claim 2, irradiating the chemically amplified resist film in a pattern with electron beam, and developing the chemically amplified resist film with an alkaline developer to obtain a resist pattern.

10. The conductive polymer composition according to claim 1, further comprising a water-soluble polymer.

11. The conductive polymer composition according to claim 10, wherein the content of the gemini surfactant is 10 parts by mass to 1,000 parts by mass relative to 100 parts by mass of a composite of the π-conjugated conductive polymer and the polyanion.

12. A patterning process comprising steps of forming an antistatic film on a chemically amplified resist film of a substrate having the chemically amplified resist film from the conductive polymer composition according to claim 10, irradiating the chemically amplified resist film in a pattern with electron beam, and developing the chemically amplified resist film with an alkaline developer to obtain a resist pattern.

13. The conductive polymer composition according to claim 1, wherein the content of the gemini surfactant is 10 parts by mass to 1,000 parts by mass relative to 100 parts by mass of a composite of the π-conjugated conductive polymer and the polyanion.

14. A patterning process comprising steps of forming an antistatic film on a chemically amplified resist film of a substrate having the chemically amplified resist film from the conductive polymer composition according to claim 13, irradiating the chemically amplified resist film in a pattern with electron beam, and developing the chemically amplified resist film with an alkaline developer to obtain a resist pattern.

15. A coated article comprising an antistatic film formed from the conductive polymer composition according to claim 1 on a substrate having a chemically amplified resist film.

16. A patterning process comprising steps of forming an antistatic film on a chemically amplified resist film of a substrate having the chemically amplified resist film from the conductive polymer composition according to claim 1, irradiating the chemically amplified resist film in a pattern with electron beam, and developing the chemically amplified resist film with an alkaline developer to obtain a resist pattern.

* * * * *